(12) United States Patent
Thompson et al.

(10) Patent No.: US 9,368,624 B2
(45) Date of Patent: Jun. 14, 2016

(54) METHOD FOR FABRICATING A TRANSISTOR WITH REDUCED JUNCTION LEAKAGE CURRENT

(71) Applicant: MIE Fujitsu Semiconductor Limited, Kuwana, Mie (JP)

(72) Inventors: Scott E. Thompson, Gainesville, FL (US); Lucian Shifren, San Jose, CA (US); Pushkar Ranade, Los Gatos, CA (US); Yujie Liu, San Jose, CA (US); Sung Hwan Kim, San Jose, CA (US); Lingquan Wang, Irvine, CA (US); Dalong Zhao, San Jose, CA (US); Teymur Bakhishev, San Jose, CA (US); Thomas Hoffmann, Los Gatos, CA (US); Sameer Pradhan, Campbell, CA (US); Michael Duane, Santa Clara, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/808,122

(22) Filed: Jul. 24, 2015

(65) Prior Publication Data
US 2015/0333144 A1    Nov. 19, 2015

Related U.S. Application Data

(60) Continuation of application No. 14/534,595, filed on Nov. 6, 2014, now Pat. No. 9,196,727, which is a division of application No. 13/725,152, filed on Dec. 21, 2012, now Pat. No. 8,883,600.

(60) Provisional application No. 61/579,142, filed on Dec. 22, 2011.

(51) Int. Cl.
*H01L 21/331*    (2006.01)
*H01L 29/78*    (2006.01)
(Continued)

(52) U.S. Cl.
CPC ........ *H01L 29/7833* (2013.01); *H01L 29/0847* (2013.01); *H01L 29/105* (2013.01);
(Continued)

(58) Field of Classification Search
CPC ......... H01L 51/56; H01L 33/32; H01L 33/62; H01L 51/0072; H01L 2251/558
USPC .......................................... 438/301, 303, 369
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Banerjee, et al. "Compensating Non-Optical Effects using Electrically-Driven Optical Proximity Correction", Proc. of SPIE vol. 7275 72750E, 2009.

(Continued)

*Primary Examiner* — Andy Huynh
(74) *Attorney, Agent, or Firm* — Baker Botts L.L.P.

(57) ABSTRACT

A transistor and method of fabrication thereof includes a screening layer formed at least in part in the semiconductor substrate beneath a channel layer and a gate stack, the gate stack including spacer structures on either side of the gate stack. The transistor includes a shallow lightly doped drain region in the channel layer and a deeply lightly doped drain region at the depth relative to the bottom of the screening layer for reducing junction leakage current. A compensation layer may also be included to prevent loss of back gate control.

1 Claim, 18 Drawing Sheets

(51) Int. Cl.
*H01L 29/66* (2006.01)
*H01L 29/10* (2006.01)
*H01L 29/08* (2006.01)
*H01L 21/8238* (2006.01)

(52) U.S. Cl.
CPC ........ *H01L29/1041* (2013.01); *H01L 29/1083* (2013.01); *H01L 29/6656* (2013.01); *H01L 29/6659* (2013.01); *H01L 29/7836* (2013.01); *H01L 21/823814* (2013.01); *H01L 21/823821* (2013.01); *H01L 29/66636* (2013.01); *H01L 29/7834* (2013.01)

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yilmaz |
| 5,444,008 A | 8/1995 | Han |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farremkopf |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,153,920 A | 11/2000 | Gossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |

(56) References Cited

U.S. PATENT DOCUMENTS

| | | |
|---|---|---|
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jaehne |
| 6,893,947 B2 | 5/2005 | Martinez et al. |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu et al. |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li et al. |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |

(56) References Cited

U.S. PATENT DOCUMENTS

| | | |
|---|---|---|
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr et al. |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 8,645,878 B1 | 2/2014 | Clark |
| 8,713,511 B1 | 4/2014 | Clark |
| 8,748,270 B1 | 6/2014 | Shifren |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0227427 A1 | 10/2005 | Helm et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0108208 A1 | 5/2008 | Arevalo |
| 2008/0169493 A1 | 7/2008 | Lee |
| 2008/0169516 A1 | 7/2008 | Chung |
| 2008/0197439 A1 | 8/2008 | Goerlach |
| 2008/0227250 A1 | 9/2008 | Ranade |

(56) References Cited

U.S. PATENT DOCUMENTS

| | | |
|---|---|---|
| 2008/0237661 A1 | 10/2008 | Ranade |
| 2008/0258198 A1 | 10/2008 | Bojarczuk |
| 2008/0272409 A1 | 11/2008 | Sonkusale |
| 2009/0057746 A1 | 3/2009 | Sugll |
| 2009/0108350 A1 | 4/2009 | Cai |
| 2009/0134468 A1 | 5/2009 | Tsuchiya |
| 2009/0224319 A1 | 9/2009 | Kohli |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Hoentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 10-0794094 | 1/2008 |
| WO | 2011/062788 | 5/2011 |

OTHER PUBLICATIONS

Cheng, et al. "Extremely Thin SOI (ETSOI) CMOS with Record Low Variability for Low Power System-on-Chip Aoolications", Electron Devices Meeting (IEDM), Dec. 2009.

Machine Translation of KR 10-0794094 submitted herewith.

Ciieng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedings of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2003.

Sheu, et al. "Modeling the Well-Edge Proximity Effect in Highly Scaled MOSFETs", IEEE Transactions on Electron Devices, vol. 53, No. 11, Nos. 2792-2798, Nov. 2006.

Komaragiri, R. et al., "Depletion-Free Poly Gate Electrode Architecture for Sub 1 00 Nanometer CMOS Devices with High-K Gate Dielectrics", IEEE IEDM Tech Dig., San Francisco CA, 833-836, Dec. 13-15, 2004, Dec. 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, II et al., "Nanoscale CMOS", Proceedings of the IEEE, Vo. 87, No. 4, pp. 537-570, Apr. 1999.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content Si i-vCv Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., "Diffusion Engineering by Carbon in Silicon", Mat. Res. Soc. Symp. vol. 610, 2000.

Hokazono, a et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, Po. 459-462, 1996.

Laveant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Applications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

(56) References Cited

OTHER PUBLICATIONS

Scholz, R et al., "Carbon-Induced Undersaturat on of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High- Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Shifren, Lucian, Office Action; United States Patent and Trademark Office; U.S. Appl. No. 13/469,201, Jan. 14, 2016.

METHOD FOR FABRICATING A TRANSISTOR WITH REDUCED JUNCTION LEAKAGE CURRENT

RELATED APPLICATION

This application is a continuation of U.S. application Ser. No. 14/534,595 filed Nov. 6, 2014 and entitled "High Uniformity Screen and Epitaxial Layers for CMOS Devices", and is a divisional of U.S. application Ser. No. 13/725,152 filed Dec. 21, 2012, and now U.S. Pat. No. 8,883,600 and entitled "High Uniformity Screen and Epitaxial Layers for CMOS Devices", which claims benefit of U.S. Provisional Application No. 61/579,142, the disclosure of each is hereby incorporated by reference herein.

FIELD OF THE INVENTION

Wafers and die manufactured with CMOS compatible die and having high uniformity screen and epitaxial layers are described.

BACKGROUND

Even though electronic devices require matching transistors, in reality it is impossible to manufacture as few as two completely identical transistors, especially for nanometer scale transistors. Because of quantum mechanical effects and the randomness of transistor dopant arrangement, every transistor on a die differs slightly from each other, even if they are spaced only a few nanometers apart. This problem is even more acute when trying to replicate performance of widely spaced transistors that may be tens of thousands of nanometers apart on the same die, transistors on neighboring die in the same wafer, transistors on different wafers, or even transistors manufactured at different fabricating facilities. Variations can occur due to process differences resulting in line edge variation, to other unwanted patterning effects that change channel, gate, or spacer size, to effective work function variation due to composition or crystal formation differences in the gate; or at the atomic scale, to random dopant fluctuations in quantity and spatial positioning of individual dopants in or near the transistor channel.

Transistor matching issues generally increase in significance as transistors are decreased in size. For typical transistors, transistor width and length mismatch typically increases inversely proportional according to the square root of the transistor area. For certain transistor attributes such as off-state current or threshold voltage variation, the matching variation in nanometer scale transistors can be great enough to create an unacceptable die, or result in high device failure rates.

BRIEF DESCRIPTION OF THE DRAWINGS

For a complete understanding of the following disclosure, reference is now made to the following description taken in conjunction with the attached drawings of embodiments, wherein like reference numerals represent like parts, in which.

DETAILED DESCRIPTION

Digital and analog transistors have been available in decreasing sizes over time, with transistor channel lengths that formerly were tens of thousands of nanometers being reduced a thousand-fold to a hundred nanometers or less in length. However, because of transistor variations maintaining matching electrical characteristics for such downwardly scaled transistors is difficult at nanometer scales, and can even be more difficult for supporting circuits requiring highly matched transconductance or threshold voltage.

Figure 1:
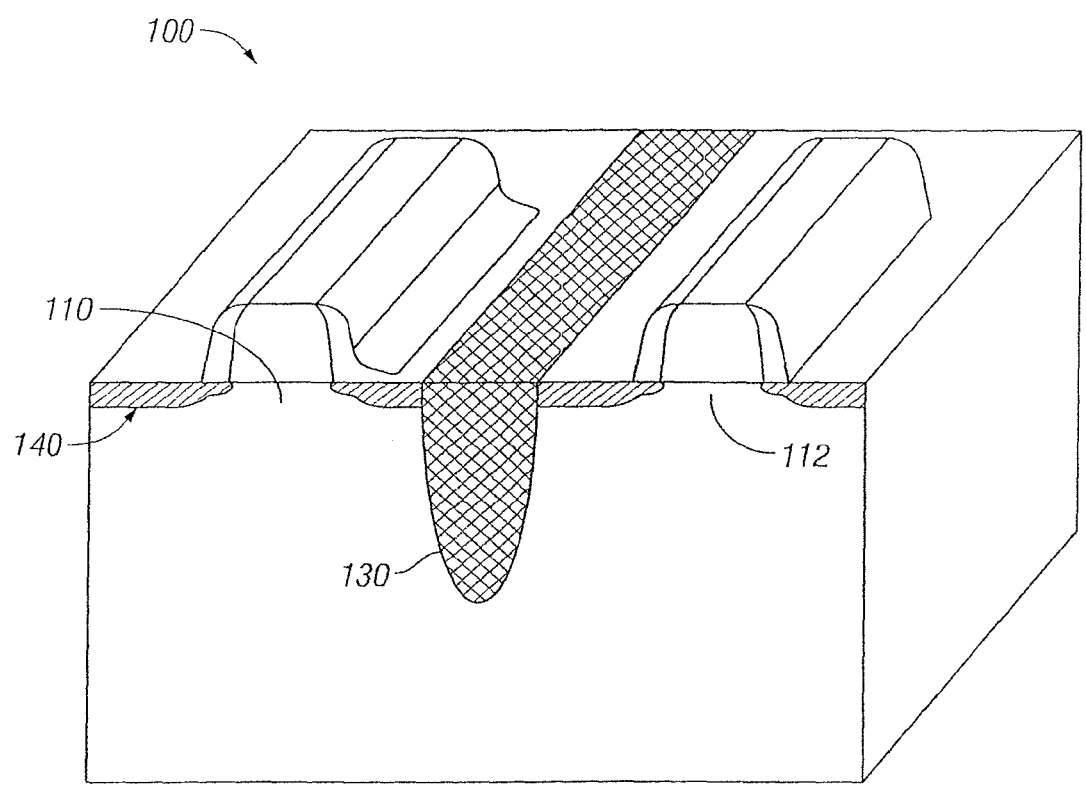
FIG. 1 illustrates a three dimensional cross section of two adjacent transistors.
Figure 2:
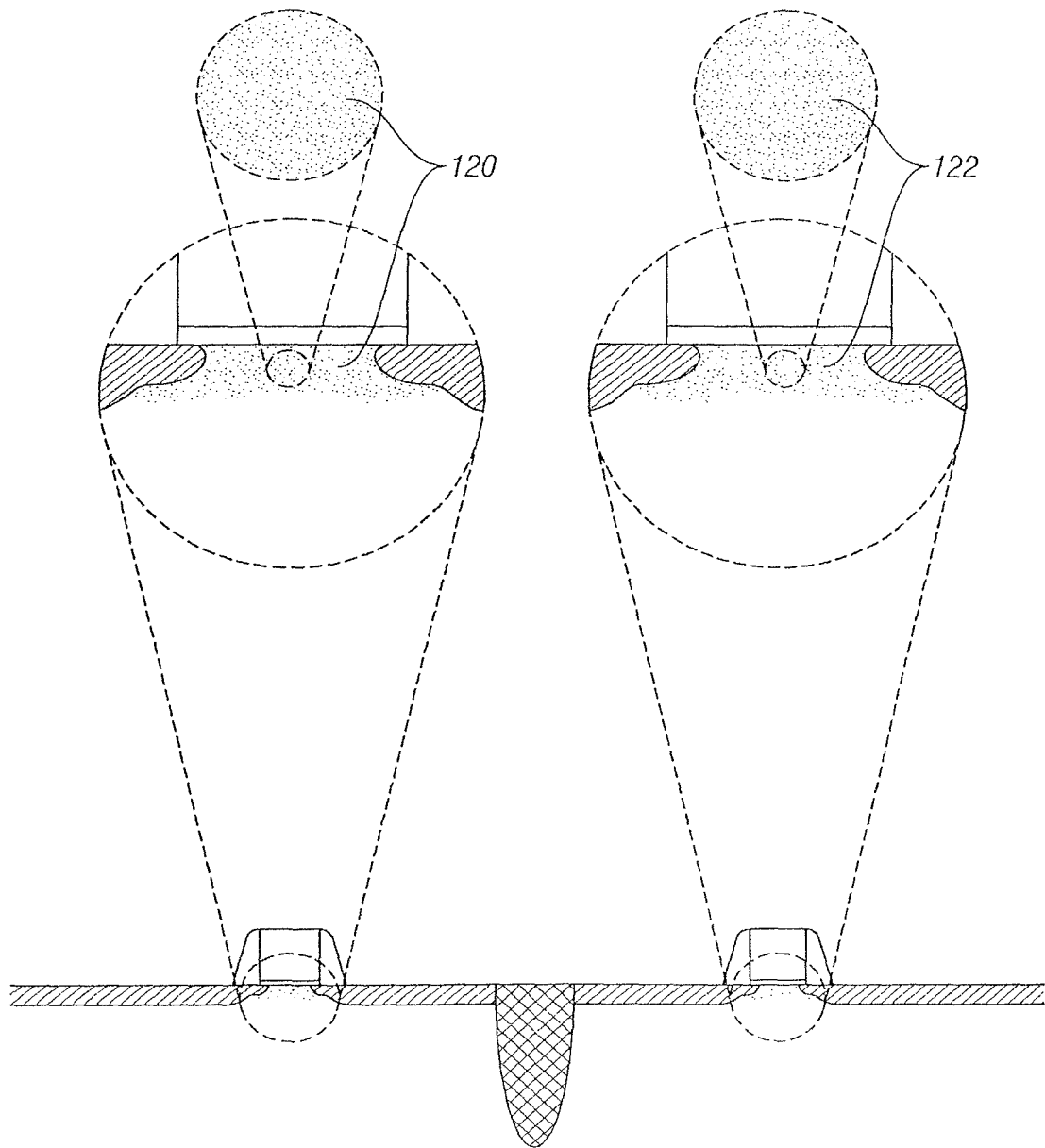
FIG. 2 illustrates an inherent uncertainty in implant placement of dopant atoms in the respective channels of each transistor.

As seen in FIG. 1, illustrating a three dimensional cartoon cross section of two adjacent transistors, an ideally matched 14 nanometer node CMOS FET transistor pair 100 separated by shallow trench isolation 130 includes two channels 110 and 112 formed from a semiconductor crystalline lattice (typically silicon or silicon-germanium). The channels 110 and 112 incorporate a small number of positively or negatively electrically charged dopant atoms in the lattice such as boron or arsenic. In addition, dopants can include deliberately implanted, but uncharged, diffusion mitigation atoms such as carbon, or various contaminant atoms that are either in the crystal lattice or in inter-lattice sites. For a transistor created to have a fourteen (14) nanometer gate length, there might be as few as 200 dopant atoms in a channel. Ideally, each transistor would have identical numbers and type of dopant atoms in the channel, and placement of the dopant atoms would be the same. However, in practice, as seen in two dimensional cartoon form in FIG. 2, the inherent uncertainty in implant placement of dopant atoms 120 and 122 in the respective channels of each transistor can result, for example, in distinctly differing chains or clusters of dopants, or significant gaps in dopant placement, all of which lead to variations in transistor properties. As will be appreciated, such fluctuations in dopant number and placement are a major contributor to transistor variation since depth of a depletion zone created by a gate induced electric field can substantially vary in accordance with dopant distribution. In addition to electrical effects relating to channel formation, presence of carbon or other uncharged atoms can interfere with charged carrier movement between source and drain of the transistor, providing variations in carrier mobility and transconductance.

Figure 3:
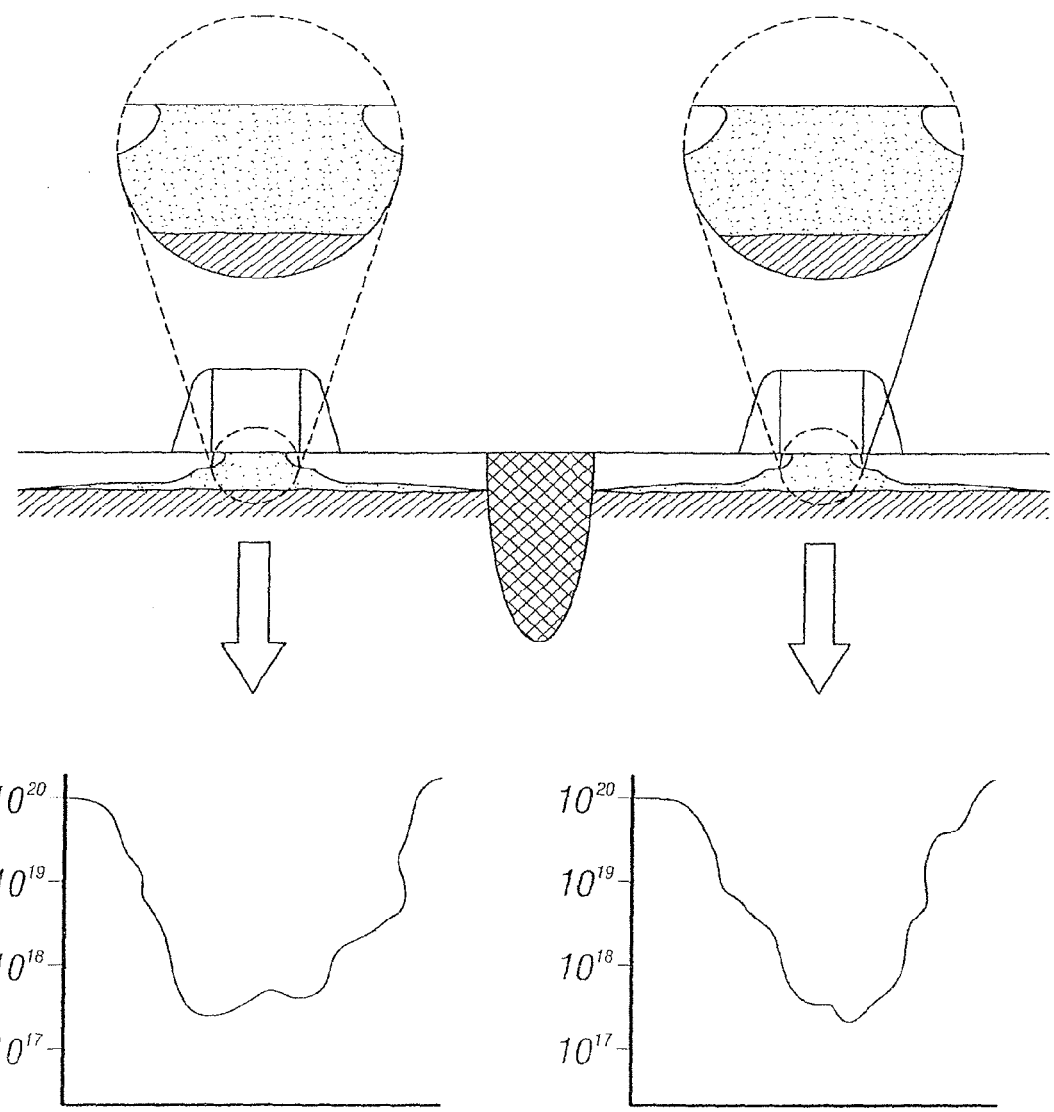
FIG. 3 illustrates dopant placement along the channel with representative graphs of dopant concentration and placement.

One way of minimizing such transistor variation and mismatch is to greatly reduce or effectively eliminate dopants in the channel. For example, an undoped epitaxial layer capable of acting as a channel can be selectively grown, with controlled ion implantation to form a channel. Unfortunately, while this can reduce random dopant fluctuations, such substantially undoped channels do not eliminate all problems associated with dopant variation. Instead, as seen in FIG. 3, which is a cartoon representing dopant placement along the channel, with representative graphs of dopant concentration and placement, variation in placement and amount of dopants around the channel will occur. Such dopant variations can occur because of out-diffusion from the source or drain, variations in dopant implant depth along the channel, and variations in lateral and vertical dopant profiles, all leading to variations in transistor characteristics. In addition, halo implants are often used to create a localized, graded dopant distribution near a transistor source and drain that extends into the channel. Halo implants are often required by transistor designers who want to reduce unwanted source/drain leakage conduction or "punch through" current. In a manner similar to threshold voltage implants, conventional halo implants tend to introduce dopant species into unwanted areas through random dopant fluctuation caused by a variety of factors including scattering effects, crystal lattice channeling effects, lateral straggle, secondary diffusion, or simple variability in halo dopant energies and implantation angle.

Figure 4:
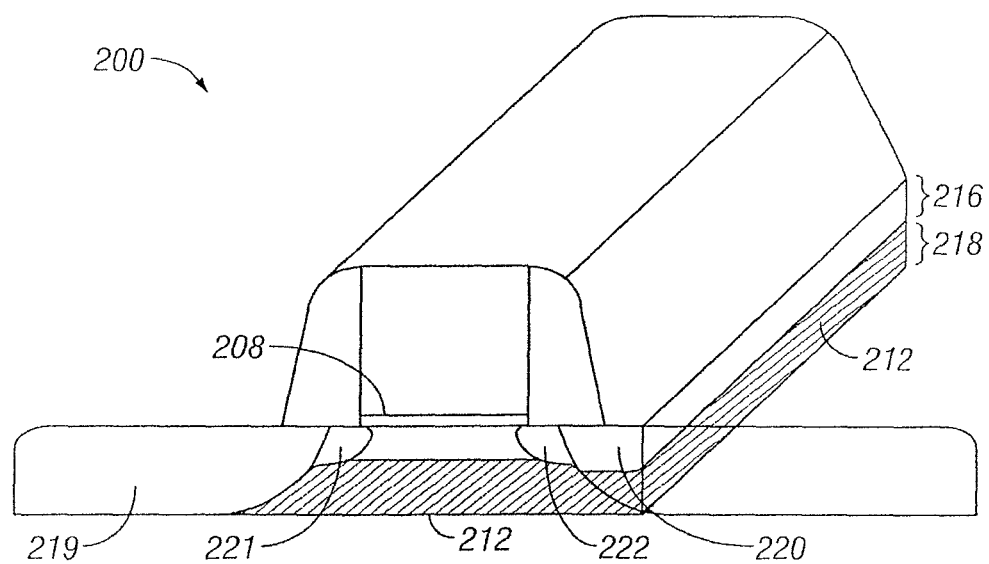
FIG. 4 illustrates a transistor formed on a well incorporating a heavily doped screening layer that completely extends under a gate area.
Figure 5:
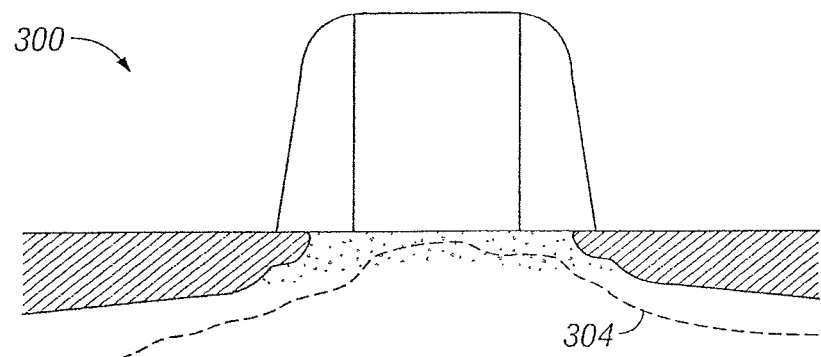
FIG. 5 illustrates an epitaxial transistor having a retrograde dopant profile.
Figure 6:
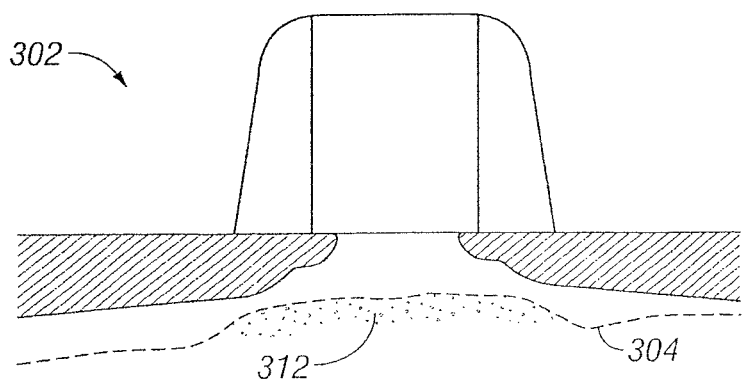
FIG. 6 illustrates a similarly sized transistor with an atomically uniform screening layer.

To provide a range of highly matched transistor device types as seen in FIG. 4, a transistor 200 formed on a well can incorporate a heavily doped, defined thickness, and highly doped screening layer 212 that completely extends in the lateral direction under a gate area. In operation, a gate induced electric field and consequent depletion zone extends to the screening layer. Preferably, an undoped blanket epitaxial layer grown on the wafer to form a layer that extends across multiple transistors forms the undoped channel. Alternatively, a selective epitaxial channel layer is individually grown on this screening layer. In all instances, efforts are made to maintain the channel layer as undoped, unless the transistor design calls for a slightly doped channel, usually in order to achieve a higher threshold voltage. Unwanted diffusion is minimized by use of processing temperatures lower than 900 degrees or, or in addition to, Diffusion mitigation carbon caps can be included in the top layers of the screen to avoid the dopants from the screen from diffusing. Halo or threshold implants are minimized or absent. Since there is minimal dopant presence in the channel, there is minimal variation in dopant positioning or concentration in the channel, and transistor channels are well matched. However, this does not completely eliminate the problem of transistor mismatch, since epitaxial layer thickness can vary under the gate, causing substantial differences in threshold voltage or other transistor performance characteristics. As seen in FIG. 4, to further reduce transistor mismatch, the screening layer 212 is maintained as an atomically uniform layer that extends a precise distance 216 from a gate dielectric 208. Screen layer 212 extends laterally across the channel to abut the source and drain 219, 220. Preferably, the screen layer 212 is positioned to be either just underneath and abutting the bottom of or is located at approximately the bottom ⅓ to ¼ of the lightly doped drain extensions 221, 222 and extending downward to form a preselected thickness wherein the screen layer 212 approximately ends a distance above the bottom horizontal portion of the source and drain 219, 220. The targeted thickness for the screen layer 212 depends on the device design in terms of requirements for threshold voltage and junction leakage, among other things, and to what extent a separate anti-punch through region (not shown) is used. The precise depth and thickness of the formed epitaxial channel layer is maintained over at least 80% of the gate dielectric area, and depth and thickness may slightly increase or decrease along the edge of the gate dielectric due to well proximity or etch effects. Typically, adjacent transistors will have a gate dielectric to screening layer thickness that only varies within a one-half nanometer range, while more distant transistors on the same die will still have a channel layer thickness that varies within one nanometer. Additionally, the screen layer can have a dopant concentration between $1\times10^{18}$ and $1\times10^{19}$ atoms per cubic centimeter or higher concentration, and further has a defined thickness of between five (5) and twenty (20) nanometers that varies no more than three (3) nanometers. The highly doped screen layer, together with the anti-punchthrough region (if present), creates a strong body coefficient, making the transistor amenable to be back-biased by electrically connecting a body tap to the screen layer. The back-biasing capability afforded by the highly doped screen layer enables greater flexibility for chip designs. Maintaining a controlled thickness 218 of the screening layer 212 additionally helps to match leakage current and body bias related performance factors. The tight control of screening layer positioning results in tight control of the depletion zone when the transistor gate is activated. For comparison, as seen in two dimensional cross section embodied in FIG. 5, a conventional transistor 300 having a retrograde dopant profile that is conventionally formed using buried implants may have an irregular depletion zone 304 due to varying concentrations and position of dopants. As seen in FIG. 6, similarly sized transistor 302 with an atomically uniform screening layer 312 will have a uniform depletion zone 314 set by the screening layer 312, and with minimal edge effects.

In certain embodiments, forming a blanket epitaxial layer can further include steps related to implanting or growing (via incorporation of dopants or diffusion mitigation atoms such as carbon) various channel dopant profiles deposited on a wafer over the screening layer. These profiles can extend across multiple die and transistor die blocks to give transistors with highly uniform three-dimensional structures. Such a blanket epitaxial layer, particularly after all well implants are done, helps to reduce upward migration of dopants emplaced during the well implants (to form the screening and other doped layers). In other embodiments, lightly doped Vt adjustment layers can be formed in but after formation of the epitaxial layer, allowing further adjustment of various transistor characteristics, including threshold voltage and leakage current, particularly in the context of forming a plurality of devices having different threshold voltage and other characteristics, for instance to create a SOC.

Transistors that contain the foregoing screening layer transistor structures are referred to herein as deeply depleted channel field effect transistors (DDC-FETs). DDC-FETs have a number of advantages in terms of electrical performance over conventional FETs at the same technology node. These advantages include, but are not in any way limited to, reduced subthreshold conduction (i.e., reduced off-state leakage current). Because modern integrated circuits typically include many millions of transistors, reduced off-state leakage current in these transistors can provide many benefits including a longer battery-life for a mobile device. DDC-FETs are also advantageous in terms of reduced threshold voltage variation across a given region of an integrated circuit. This type of threshold voltage variation is referred to as sigma Vt (σVt). Circuit designers recognize the many well-known benefits of reduced variation (or increased uniformity) in the electrical characteristics of the devices that are available for them to incorporate into their designs. By way of example and not limitation, the use of devices with a smaller variation in electrical characteristics can provide circuit designs with improved performance and allow the usage of lower supply voltage for the circuits while maintaining yield targets. Embodiments of various DDC-FET transistor structures and manufacturing processes suitable for use in the applications and processes according to the present disclosure are more completely described in U.S. Pat. No. 8,273, 617 titled Electronic Devices and Systems, and Methods for Making and Using the Same, U.S. patent application Ser. No. 12/971,884 titled Low Power Semiconductor Transistor Structure and Method of Fabrication Thereof, U.S. patent application Ser. No. 12/971,955 titled Transistor with Threshold Voltage Set Notch and Method of Fabrication Thereof, and U.S. patent application Ser. No. 12/895,785 titled Advanced Transistors With Threshold Voltage Set Dopant Structures, the disclosures of which are hereby incorporated by reference in their entirety.

One exemplary process for forming a transistor begins at the well formation, which may be one of many different processes according to different embodiments and examples. Well formation is preferably before but may be after STI (shallow trench isolation) formation, depending on the application and results desired. Boron (B), indium (I) or other acceptor dopant materials may be used for P-type doping, and arsenic (As), antimony (Sb) or phosphorous (P) and other donor dopant of materials may be used for N-type doping. A germanium (Ge) followed by carbon (C) implant or in-situ doped carbon epi or cold or room temperature carbon implant may optionally be performed to reduce dopant migration. Well implants may include sequential implant, and/or epitaxial growth and implant of punch through suppression regions, with screening layers having a defined thickness and higher dopant density than the punch through suppression region. Threshold voltage set layers can be typically formed by implant or diffusion of dopants prior to or into a previously grown epitaxial layer formed on the already-doped screening region.

In some embodiments, the well formation may include a beam line implant of Ge/C followed by or done after B (for N-FET), As (for P-FET), or Sb (for P-FET) in multiple steps so as to form distinct regions for screen and threshold voltage (and anti-punchthrough, if any) followed by an epitaxial (EPI) pre-clean process, and followed finally by non-selective blanket EPI deposition. Alternatively, the well may be formed using plasma implants of the same aforementioned materials, followed by an EPI pre-clean, then finally a non-selective (blanket) EPI deposition. As yet another alternative, well formation may simply include well implants, followed by in-situ doped EPI (which may be selective or blanket) to form the screening layer and other doped regions. Embodiments described herein allow for any one of a number of devices configured on a common substrate with different well structures and according to different parameters. Shallow trench isolation (STI) formation, which, again, may occur before or after well formation, may include a low temperature trench sacrificial oxide (TSOX) liner at a temperature lower than 900 degrees C. A gate stack may be formed or otherwise constructed in a number of different ways, from different materials, and of different work functions. One option is a gate-first process that includes SiON/Metal/Poly and/or SiON/Poly, followed by high-k/Metal Gate. Another option, a gate-last process includes a high-k/metal gate stack wherein the gate stack can either be formed with "high-k first-Metal gate last" flow or "high-k last-Metal gate last" flow. Yet another option is a metal gate that includes a tunable range of work functions depending on the device construction. Next, Source/Drain extensions (lightly doped drain (LDD)) may be implanted, or optionally may not be implanted depending on the application. The dimensions of the extensions can be varied as required, and will depend in part on whether gate spacers are used and requirements for the gate width. In one option, there may be no tip (or LDD) implant. Next, the source and drain contacts are formed. In some embodiments, the PMOS source and drain is created by way of selective epi. In other embodiments, both PMOS and NMOS source and drain may be formed by selective epi as performance enhancers for creating strained channels and/or reduction of contact resistance.

Figure 7:
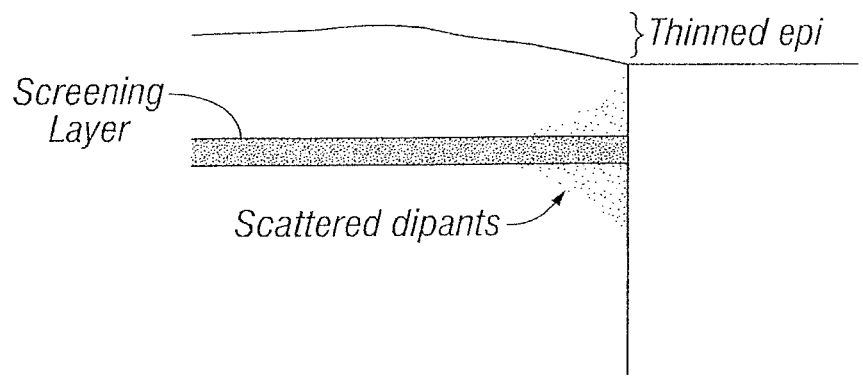
FIG. 7 illustrates etch steps that thin portions of the epitaxial layer or, through well proximity effects, allow an increase or decrease in dopant layer concentration near isolation structures.
Figure 8:
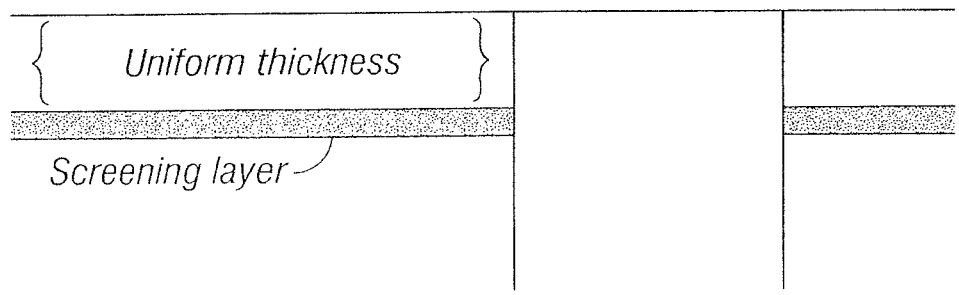
FIG. 8 illustrates constant thickness epitaxial layers with respect to a screening layer and a shallow trench isolation (STI) formed post-well implant to limit secondary dopant scattering.

As illustrated in FIG. 7, in certain embodiments etch steps can thin portions of the epitaxial layer, or preferably, through well proximity effects, allow an increase or decrease in dopant layer concentration near isolation structures. Well proximity effects are described in "Lateral Ion Implant Straggle and Mask Proximity Effect", IEEE TRANSACTIONS ON ELECTRON DEVICES, VOL. 50, NO. 9, SEPTEMBER 2003. To prevent such implant related effects, use of a screening layer covered by blanket epitaxial layers can be used, along with post-well implant trench isolation eliminating much of the dopant scattering attributable to resist or isolation structures. Such structures are illustrated in cartoon form as FIG. 8, which shows constant thickness epitaxial layers with respect to a screening layer, and a shallow trench isolation (STI) formed post-well implant to limit secondary dopant scattering. Such structures are described in U.S. patent application Ser. No. 13/469,583 titled "Transistor with Reduced Scattered Dopants" the disclosure of which is herein incorporated by reference.

Though shown with a channel layer and screening layer underneath the gate, the transistor structure may be formed as a three layer stack with a screening layer, a threshold voltage control layer, and a channel layer. The threshold voltage control layer may be selectively doped to provide threshold voltage control for the transistor device.

For operation, the transistor device has a heavily doped screening layer preferably with a sharp doping profile to provide extremely low Drain Induced Barrier Lowering (DIBL) and threshold voltage variation between adjacent transistors (σVt). However, as a general matter, the higher dopant concentration of screen layer 212 with a sharper profile on the bottom can result in a higher junction leakage. This characteristic, while not a problem in most devices including regular or low Vt devices, for those device specifications that require ultra-low leakage current, additional techniques may be desired to help to minimize junction leakage. Described below are techniques that may be selectively or comprehensively integrated to achieve lower junction leakage current when called for in the device design. A typical application for the below techniques is for High Vt and Ultra-High Vt devices using a highly doped screening layer.

Figure 9B:
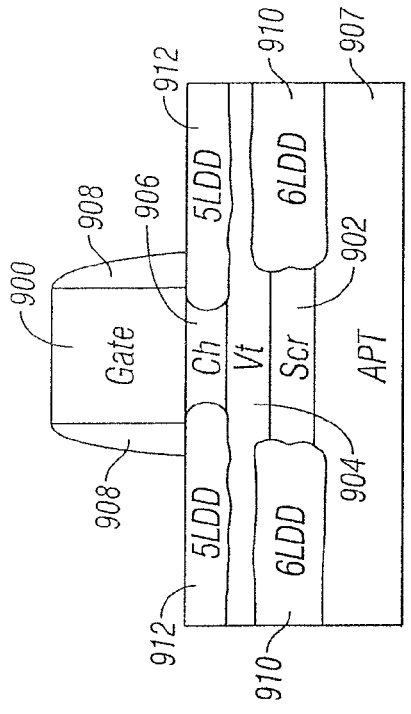
FIGS. 9A-9D illustrate an example fabrication process for reducing junction leakage current in a transistor device.
Figure 9D:
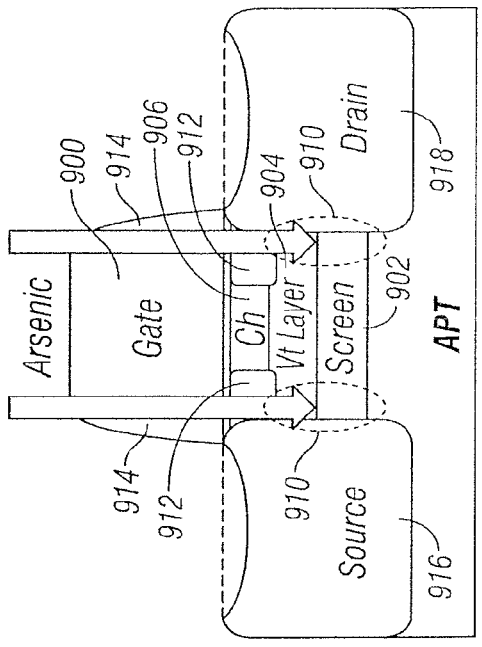
Figure 9A:
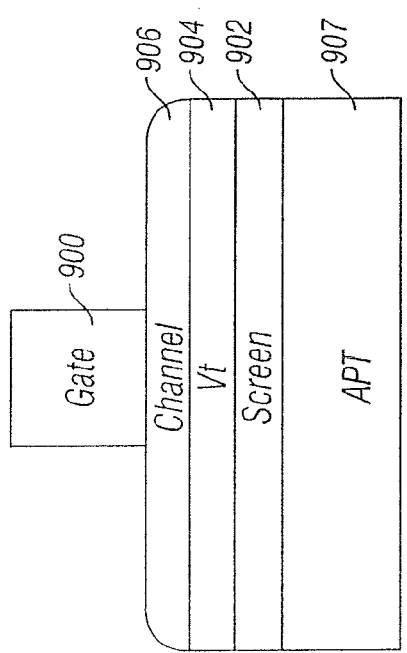

FIGS. 9A-9D show an example fabrication process for reducing junction leakage current in the transistor device. In FIG. 9A, the three layer stack is formed underneath a gate 900. The three layer stack includes a screening layer 902, a threshold voltage control layer 904, and a channel layer 906. Screening layer 902 may have a dopant concentration between $1 \times 10^{18}$ and $1 \times 10^{20}$ atoms/cm$^3$ with a thickness preferably between 5 and 20 nanometers. Threshold voltage control layer 904 has a dopant concentration less than screening layer 902, for example between $5 \times 10^{17}$ and $1 \times 10^{18}$ atoms/cm$^3$ with a thickness preferably between 5 and 20 nanometers. For a NMOS device, screening layer 902 and threshold voltage control layer 904 may be formed with boron or other acceptor dopant materials, and may further include a carbon-doped region formed using in-situ epi or, if implanted, using a cold carbon implant or by first using a germanium pre-amorphization implant, in order to form a barrier to inhibit the migration of boron dopant atoms. Channel layer 906 is an undoped epitaxial layer formation with a thickness of 5 to 25 nanometers. An optional anti-punchthrough layer 907 may underlie the three layer stack of screening layer 902, threshold voltage control layer 904, and undoped channel layer 906.

In FIG. 9B, in an embodiment, a first offset spacer 908 is formed on the vertical sides of gate 900. A deep lightly doped drain (dLDD) region 910 is implanted into the structure and targeted to a preselected depth, which may be at a depth of the screening layer 902. The purpose of dLDD region 910 is to further grade the interface between screening layer 902 and the subsequently formed source and drain regions beyond benefits provided with a regular LDD. An example condition for forming dLDD region 910 may include a dose of $5 \times 10^{13}$ to $1.5 \times 10^{14}$ atoms/cm$^2$ at an energy of 10 to 14 keV. Arsenic may be used as the material for an NMOS dLDD region 910. After formation of dLDD region 910, a shallow lightly doped drain (sLDD) region 912 is implanted into the structure, preferably using conventional implant methods.

Figure 9C:
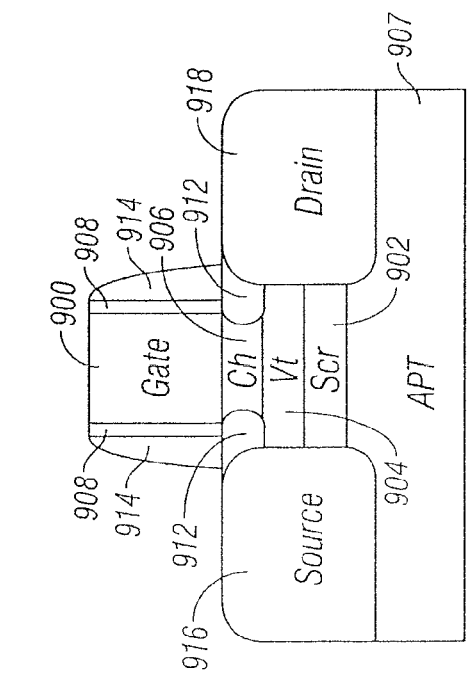

IN FIG. 9C, a second offset spacer 914 is formed preferably on the first offset spacer 908. A source region 916 and a drain region 918 are preferably formed next. FIG. 9D illustrates an exemplary location of dLDD region 910 in relation to screening layer 902, source region 916, and drain region 918.

Figure 10:
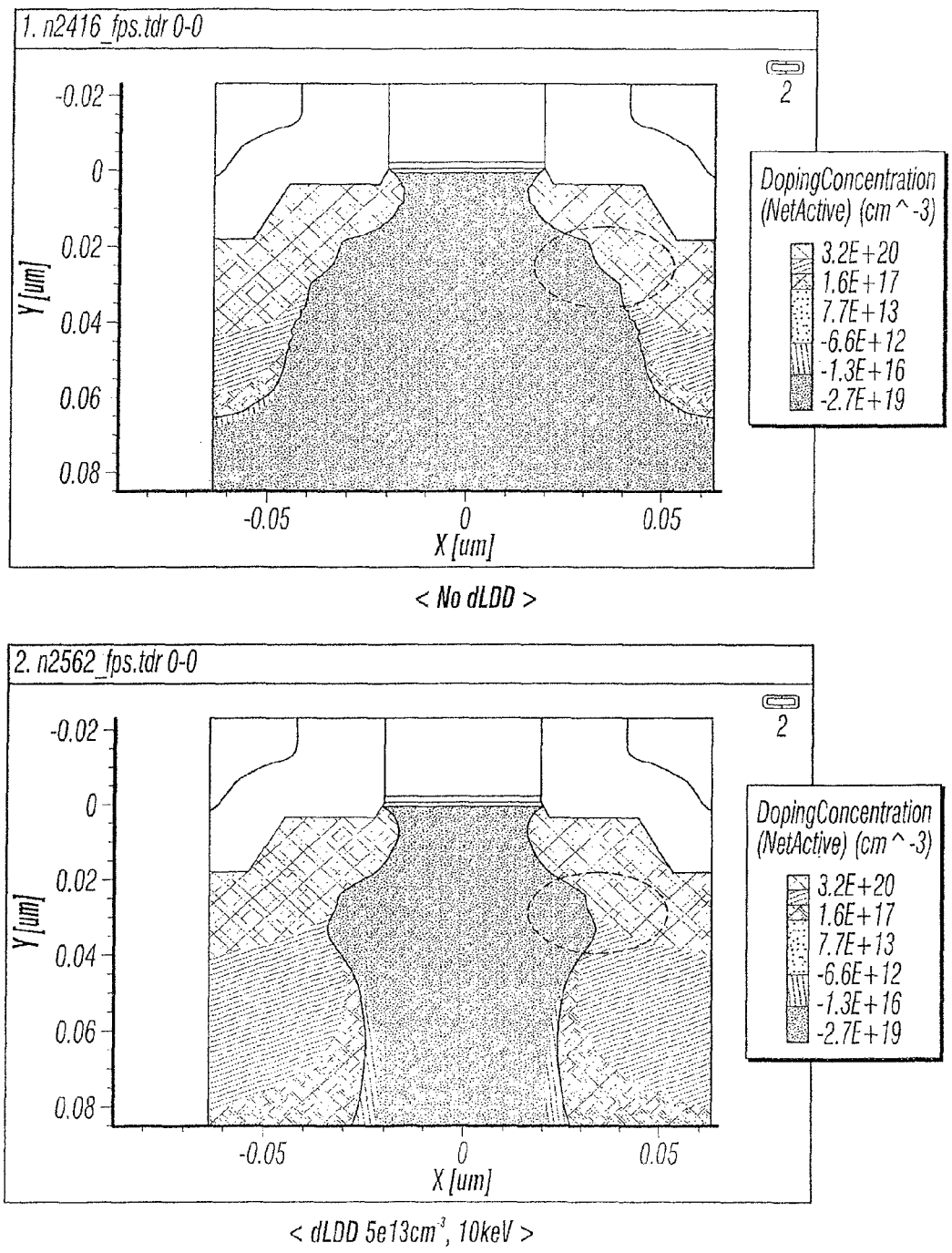
FIG. 10 illustrates a comparison of a structure without a dLDD region, a structure with a dLDD region having a first dose and a structure with a dLDD region 910 having a second dose.
Figure 10:
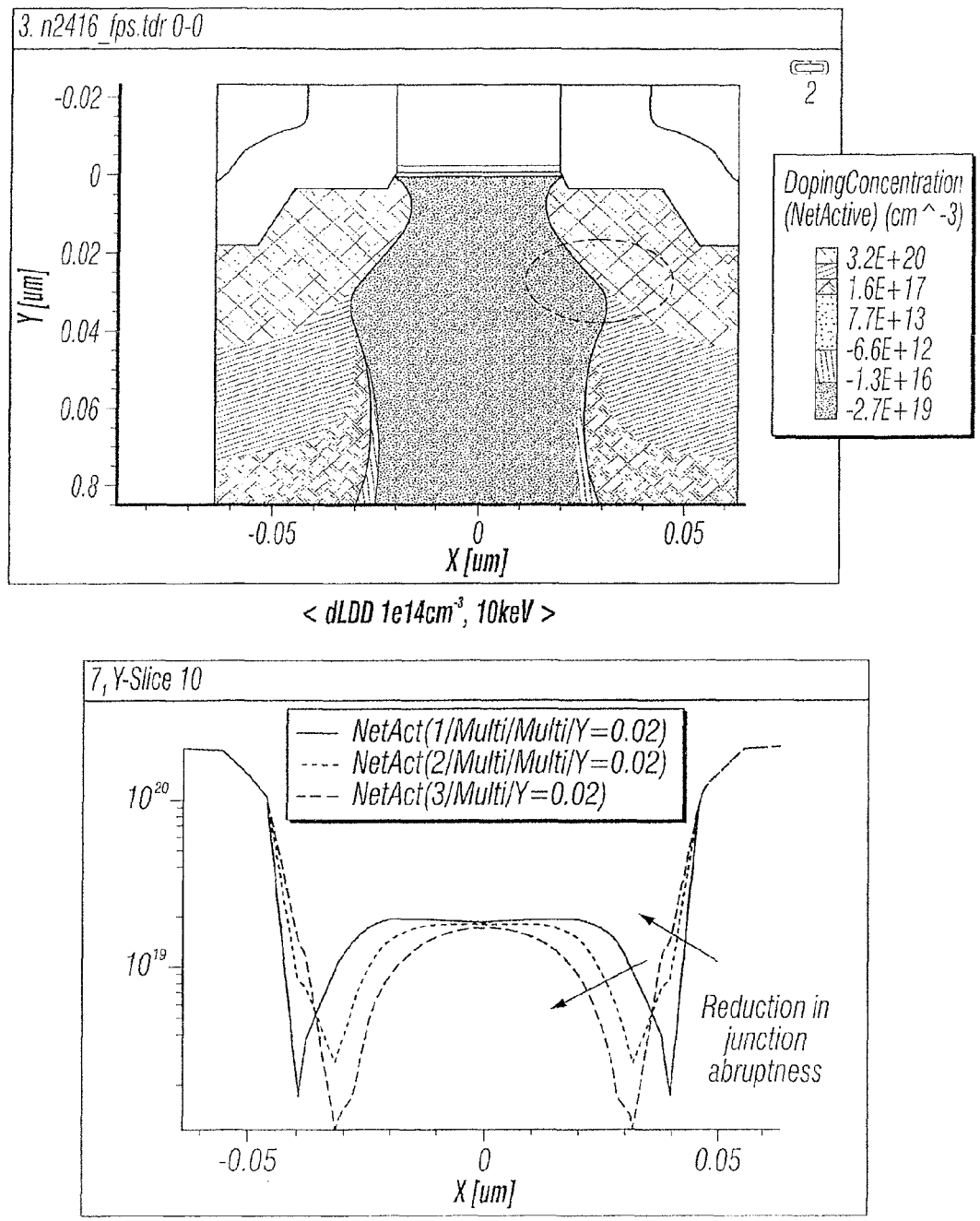

FIG. 10 shows a comparison of a structure without a dLDD region 910, a structure with a dLDD region having a dose of $5 \times 10^{13}$ atoms/cm$^2$ and a structure with a dLDD region 910 having a dose of $1 \times 10^{14}$ atoms/cm$^2$ in an embodiment. The comparison shows that a reduction in junction abruptness is achieved through use of dLDD region 910. By reducing the junction abruptness of screening layer 902 between source region 916 and drain region 918, a reduction in junction leakage current occurs and thus lowering the band-to-band tunneling rate of the device.

Figure 11:
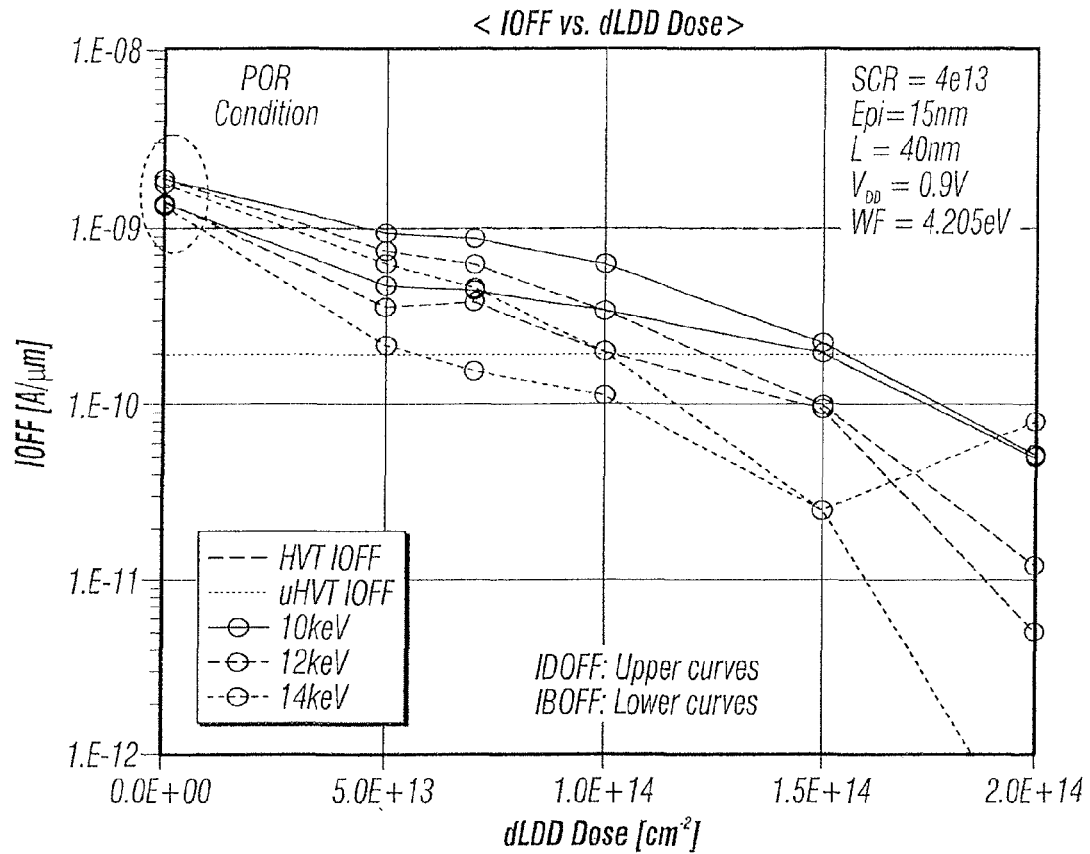
FIG. 11 illustrates the effect on leakage current for various implant conditions of a dLDD region.

FIG. 11 shows the effect on leakage current for various implant conditions of dLDD region 910 in an embodiment. Generally, increasing the dose for dLDD region 910 will reduce the junction abruptness at the source/drain interfaces to screening layer 902. With reduction in junction abruptness afforded by dLDD, junction leakage currents can be lowered for devices that include dLDD region 910.

Figure 12:
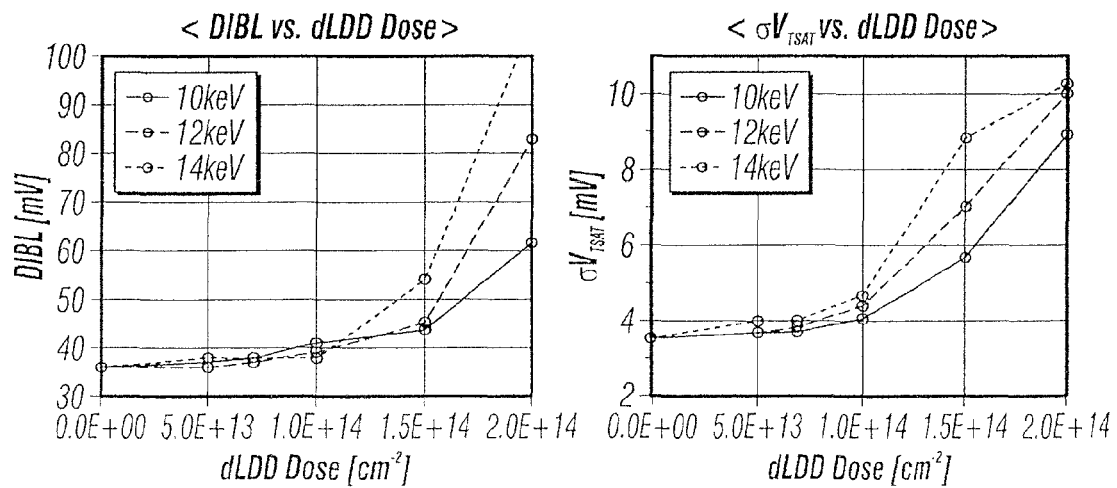
FIG. 12 illustrates the effect that a dLDD region has on DIBL and σVt.

FIG. 12 shows the effect that dLDD region 910 has on DIBL and σVt in an embodiment. DIBL and σVt begin to degrade with increasing doses for dLDD region 910. However, DIBL and σVt only slightly increase for doses up to $1 \times 10^{14}$ atoms/cm$^2$. This minimal increase is more than offset by the decrease in junction leakage current at this dose. As a result, one exemplary nominal condition for dLDD region 910 for lower junction leakage current versus short channel control is implanting Arsenic at a dose of $1 \times 10^{14}$ atoms/cm$^2$ with an energy of 14 keV in an embodiment.

The use of dLDD region 910 provides a direct way to reduce junction leakage current when implanted directly to the interface of screening layer 902 with source region 916 and drain region 918. A ten times reduction in junction leakage current is achieved using dLDD region 910. The benefits of transistor operation in the embodiment discussed above are obtained by only adding a single implant step to the fabrication process.

Figure 13:
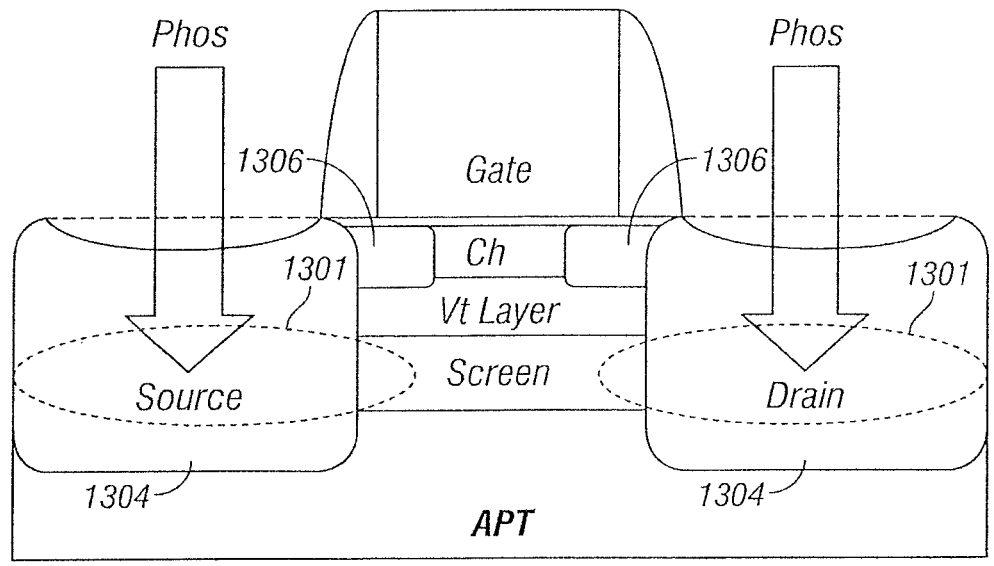
FIG. 13 illustrates a phosphorous grading implant for a transistor structure.

A phosphorous grading technique may be implemented to minimize junction leakage current by grading the interface between the screening layer and the source/drain and sLDD regions with a Phosphorous implant. FIG. 13 shows an exemplary phosphorous grading implant for the transistor structure. A grading layer 1301 is implanted at the targeted depth of an NMOS Boron screening layer 1300 prior to source/drain region 1304 implant, though the grading layer 1301 can be formed after the source/drain region 1304 implant is performed. Grading layer may be formed with a high dose of Phosphorous. Instead of implanting Arsenic for the dLDD region before the implant for the sLDD region, Phosphorous is implanted after formation of a sLDD region 1306 and after the second spacer which serves as a mask for forming the source/drain. The Phosphorous implant is physically farther away from screening layer 1302 than dLDD region 910 is from screening layer 902 in the dLDD approach. In effect, Phosphorous source/drain grading provides an indirect way to reduce junction leakage current in that it relies on implanted Phosphorous to diffuse towards the inner edges of source/drain region 1304 and screening layer 1302 interface.

Figure 14:
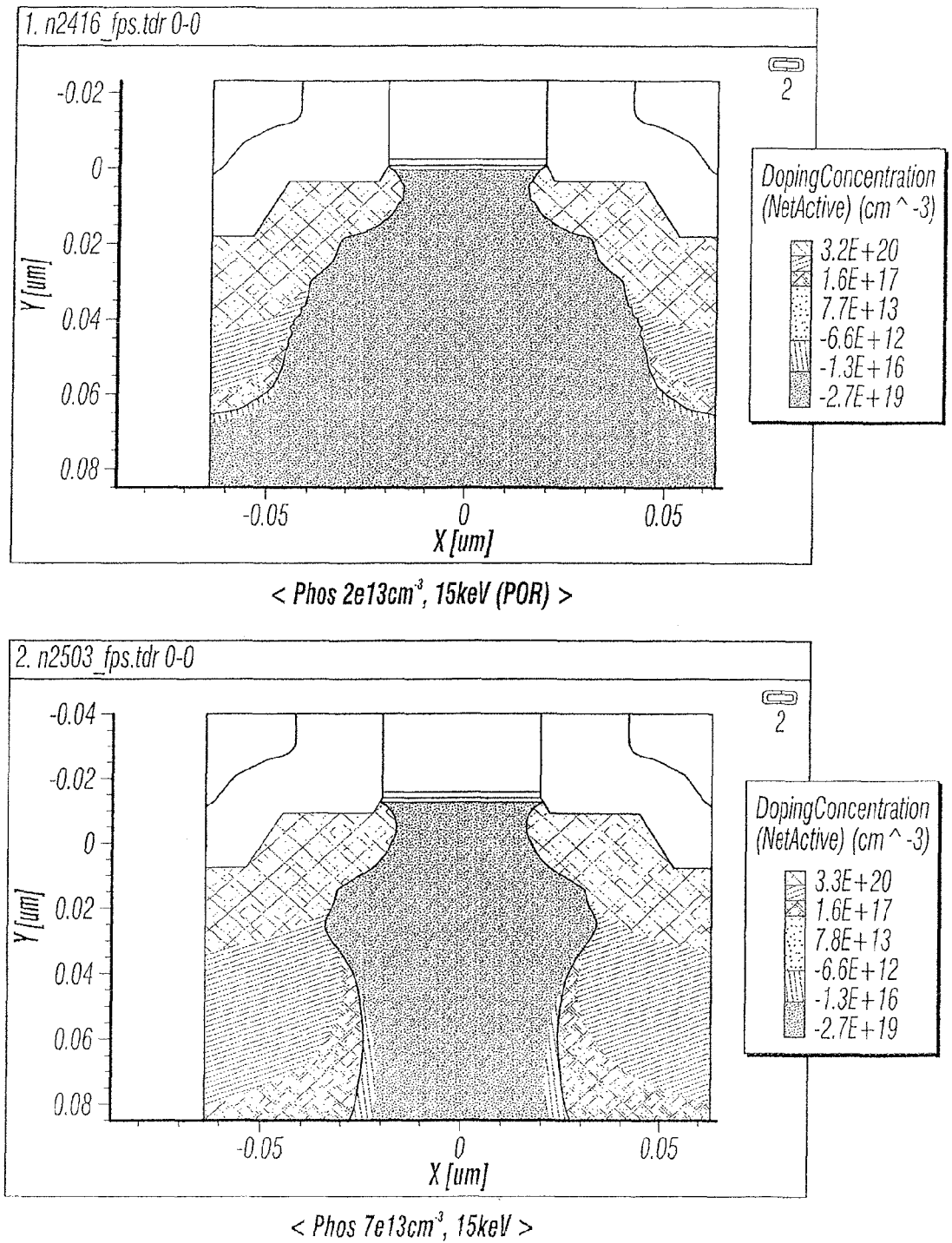
FIG. 14 illustrates a comparison of a structure with different doses of Phosphorous.
Figure 14:
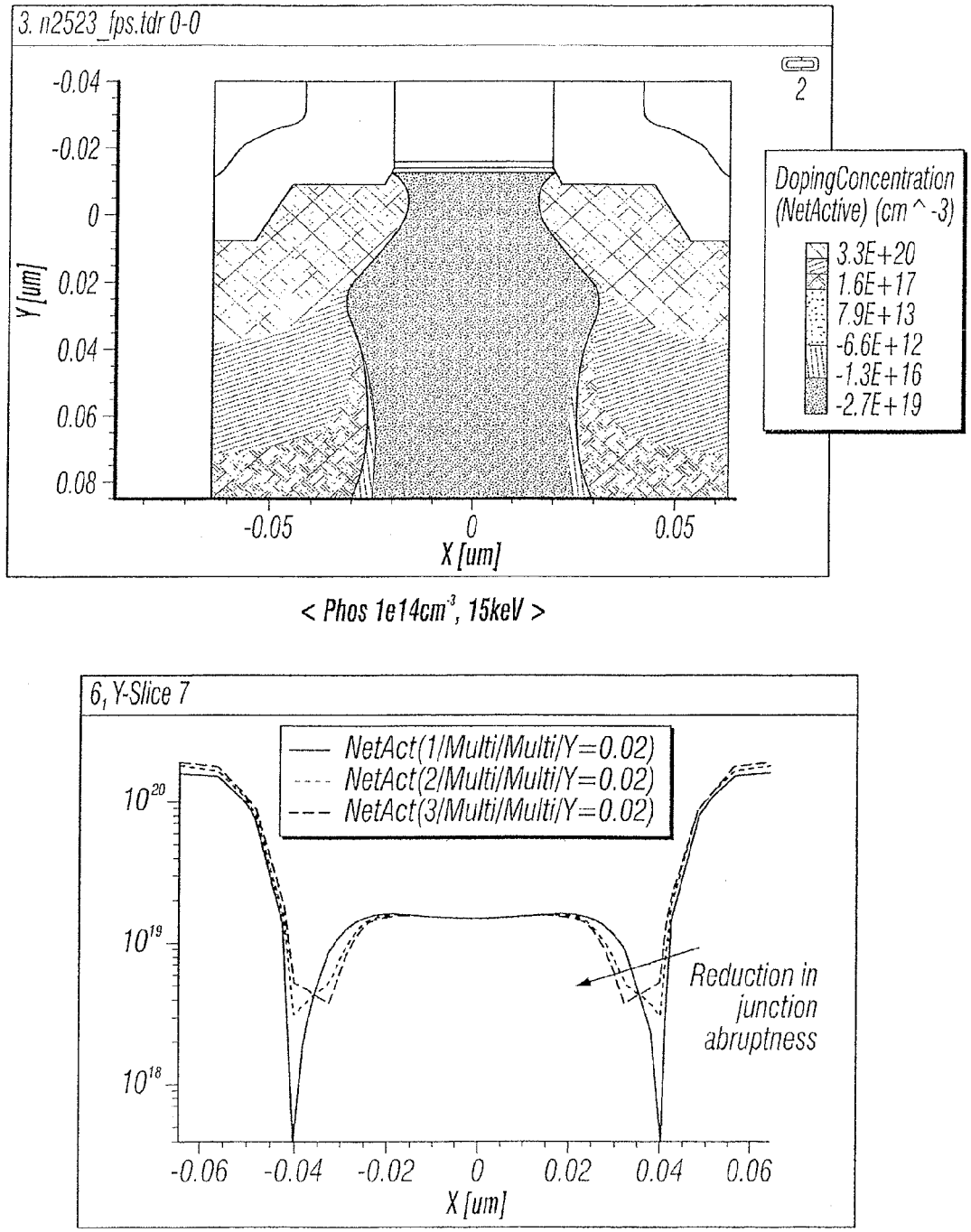

FIG. 14 shows a comparison of a structure with different doses of Phosphorous at $2 \times 10^{13}$ atoms/cm$^2$, $7 \times 10^{13}$ atoms/cm$^2$, and $1 \times 10^{14}$ atoms/cm$^2$. The comparison shows that a reduction in junction abruptness between the source/drain and the screening layer is achieved at higher doses of Phosphorous. In the embodiment, by reducing the junction abruptness of the screening layer 1302 between source/drain regions 1304, a reduction in junction leakage current occurs, thus lowering the band-to-band tunneling rate of the device.

Figure 15:
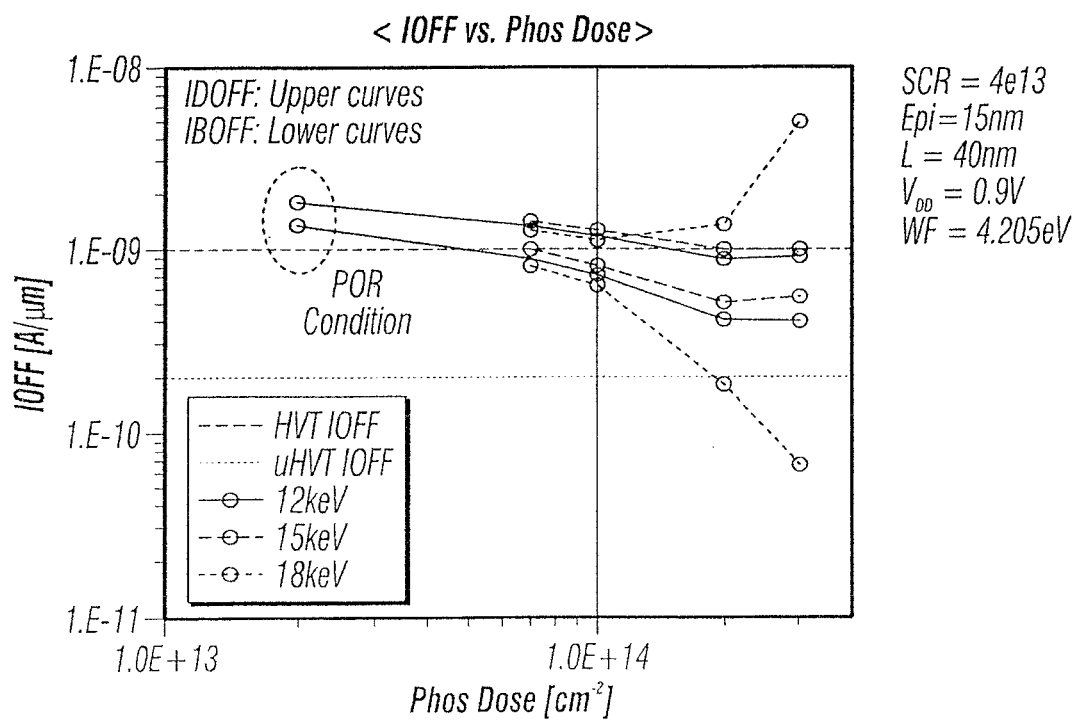
FIG. 15 illustrates a comparison of junction leakage current for different doses of Phosphorous.

FIG. 15 shows a comparison of junction leakage current for different doses of Phosphorous in an embodiment. Increasing the Phosphorous dose leads to a reduction in the junction leakage current. The decrease in junction leakage current is a result of the grading due to the enhanced lateral diffusion of the Phosphorous towards the screening layer 1302 and source/drain region 1304 interfaces.

Figure 16:
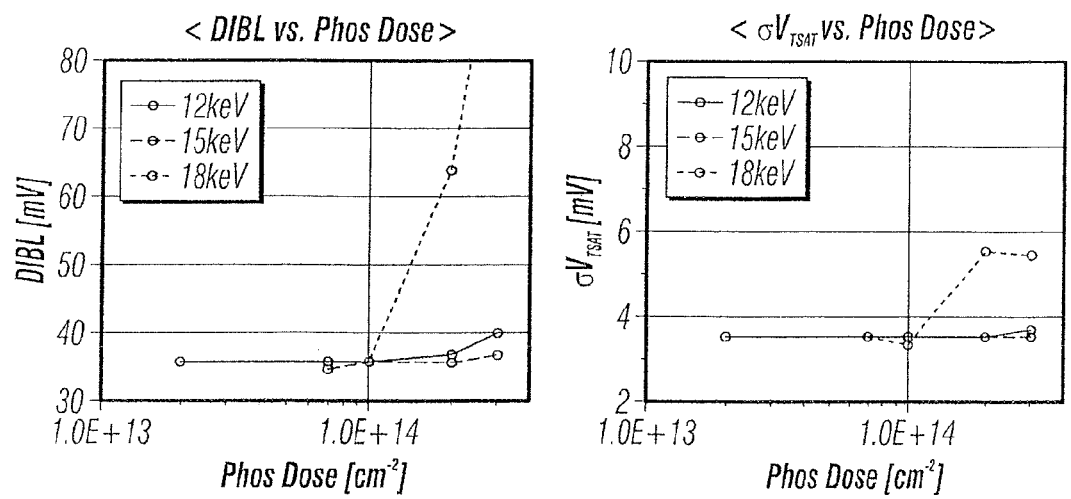
FIG. 16 illustrates a comparison of DIBL and σVt at different doses and energies for Phosphorous.

FIG. 16 shows a comparison of DIBL and σVt at different doses and energies for Phosphorous, in an embodiment. As can be seen in the graph, if the implant energy is too high, a degradation in DIBL and σVt occurs, which can be due to subsurface punchthrough. As seen in the embodiment, an exemplary nominal Phosphorous grading condition for low junction leakage current and short channel control is approximately a dose of $2\times10^{14}$ atoms/cm$^2$ at an energy of 15 keV.

The use of Phosphorous grading provides an indirect way to reduce junction leakage current when implanted prior to or after the source/drain region 1304 implant. The benefits of transistor operation discussed above are obtained by adding or modifying only a single implant step to the fabrication process.

Figure 17:
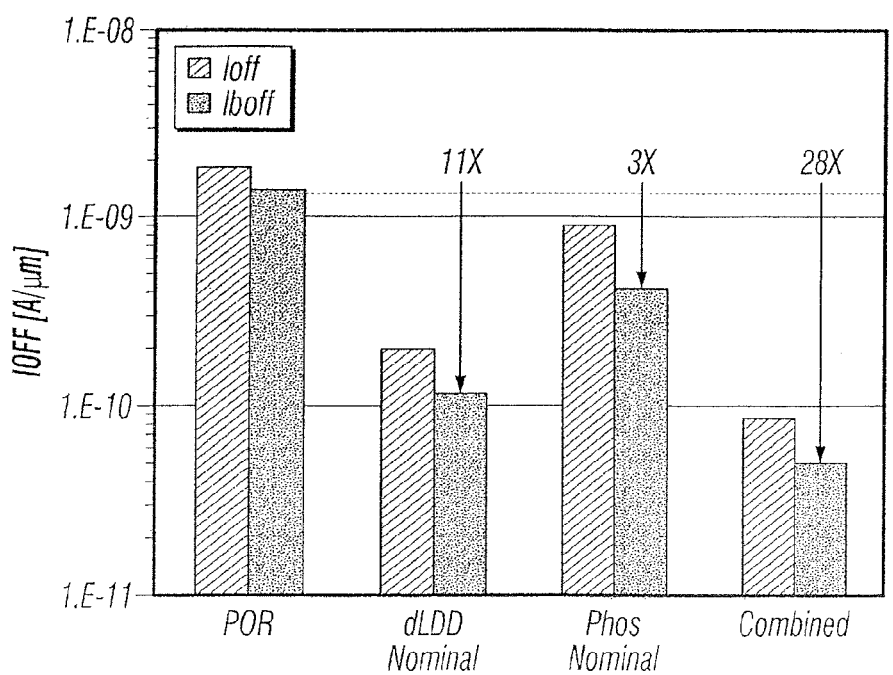
FIG. 17 illustrates a junction leakage current comparison of the dLDD approach and the Phosphorous grading approach to a reference that does not include these approaches.

FIG. 17 shows a comparison of junction leakage current reduction for a dLDD embodiment, a Phosphorous grading embodiment, and a reference embodiment that does not include these approaches. As can be seen, an eleven times reduction in junction leakage current can be achieved in the dLDD approach. A three times reduction in junction leakage current can be achieved in the Phosphorous grading approach. In another embodiment, the two approaches can be combined to provide further reduction in junction leakage current, as much as twenty-eight times compared to the reference. Thus, an additive effect occurs by performing both approaches.

Figure 18:
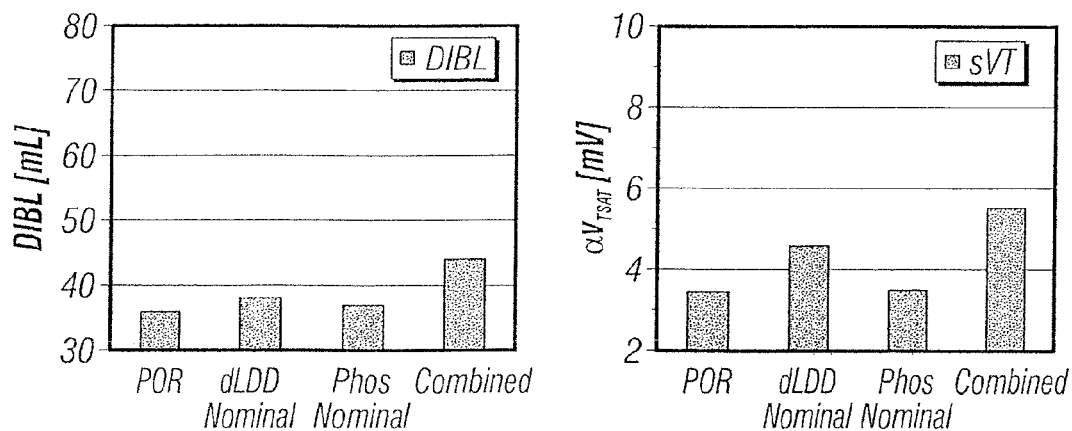
FIG. 18 illustrates a comparison of DIBL and σVt for each approach.

FIG. 18 shows a comparison of DIBL and σVt for each embodiment. A slight degradation in DIBL and σVt occurs when combining the dLDD approach with the Phosphorous grading approach. However, the reduction in junction leakage current provided by one or both approaches may more than offset any increases in DIBL and σVt.

Figure 19A:
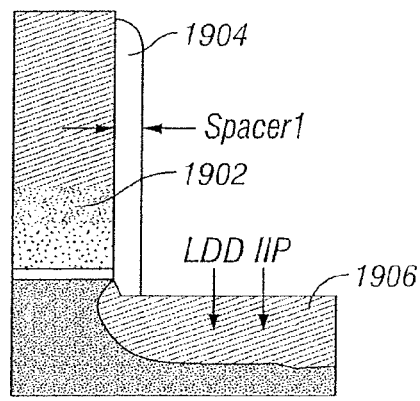
FIGS. 19A-19C illustrate the steps for a distributed source/drain implant process.
Figure 19B:
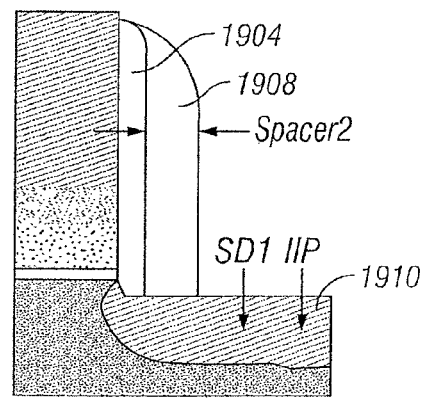
Figure 19C:
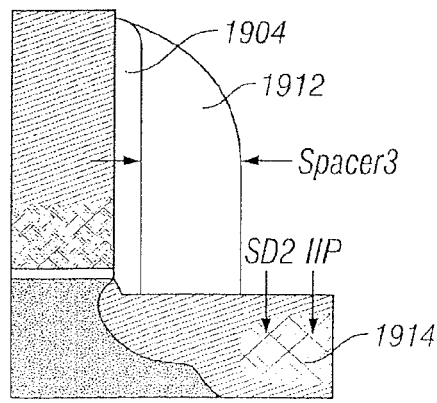

Another technique for reducing junction leakage current is to perform a distributed source/drain implant process. FIGS. 19A-19C show the steps in an embodiment of this process. In FIG. 19A, after formation of the three layer stack underneath a gate 1902, a first spacer 1904 is formed on the sidewalls of gate 1902. A sLDD region 1906 is implanted into the structure. In FIG. 19B, an intermediate spacer 1908 is formed on first spacer 1904. A dLDD region 1910 is implanted into the structure. In FIG. 19C, a second spacer 1912 is formed on intermediate spacer 1908. Alternatively, intermediate spacer 1908 may be etched back before forming second spacer 1912. After second spacer 1912 is formed, source/drain regions 1914 are implanted into the structure.

The overall thickness of the spacers in the final device structure may be set at 25 nanometers. First spacer 1904 may be formed with SiN at a thickness of 6 nanometers. Intermediate spacer 1908 may be formed with SiON at a thickness in a range of 0 to 19 nanometers. Second spacer 1912 may be formed with SiON to have the total spacer offset be 25 nanometers.

The sLDD region 1906 may include a Germanium pre-amorphizing implant followed by Carbon implant and Arsenic dopant. The dLDD region 1910 may be implanted with Phosphorous. The source/drain regions 1914 may be implanted using Arsenic.

The use of Phosphorous for the material of dLDD region 1910 allows for dLDD region 1910 to be physically closer to the screening layer than Arsenic due to its higher diffusivity. As discussed in the dLDD process and the Phosphorous grading process, the dLDD region 1910 is preferably implanted at a depth of the screening layer to influence the screening layer to source/drain junction abruptness.

Figure 20:
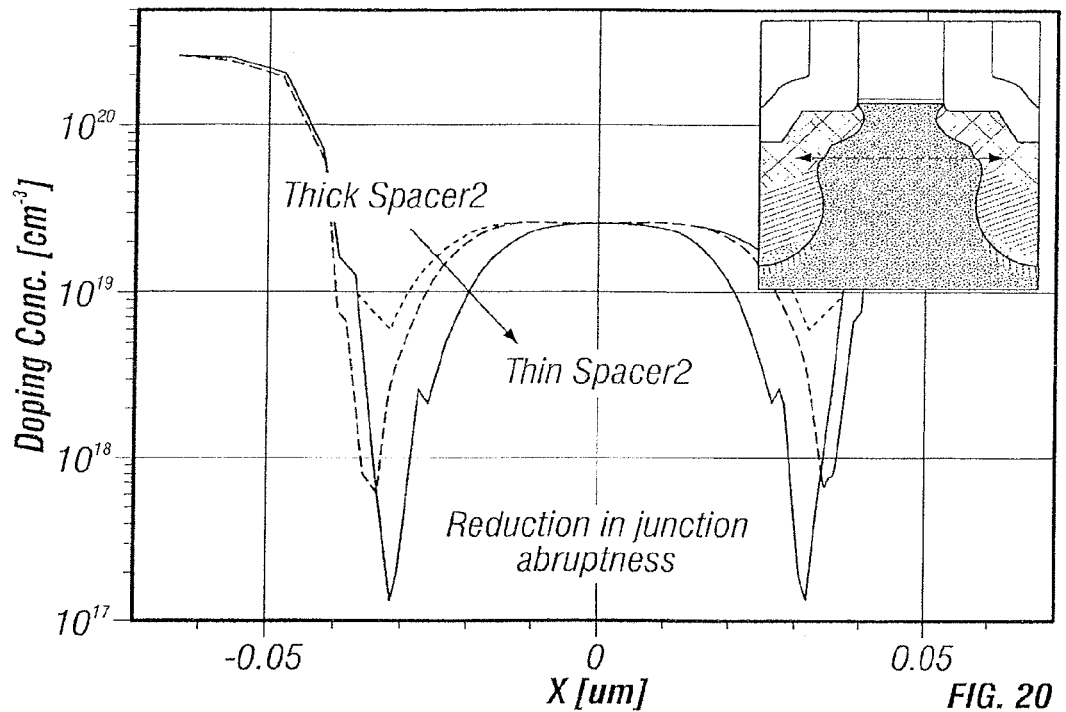
FIG. 20 illustrates a reduction in junction abruptness as a result of different thicknesses for a second offset spacer.

FIG. 20 shows an example of a reduction in junction abruptness as a result of different thicknesses for intermediate spacer 1908. Junction leakage current reduces as intermediate spacer 1908 thickness gets smaller.

Figure 21:
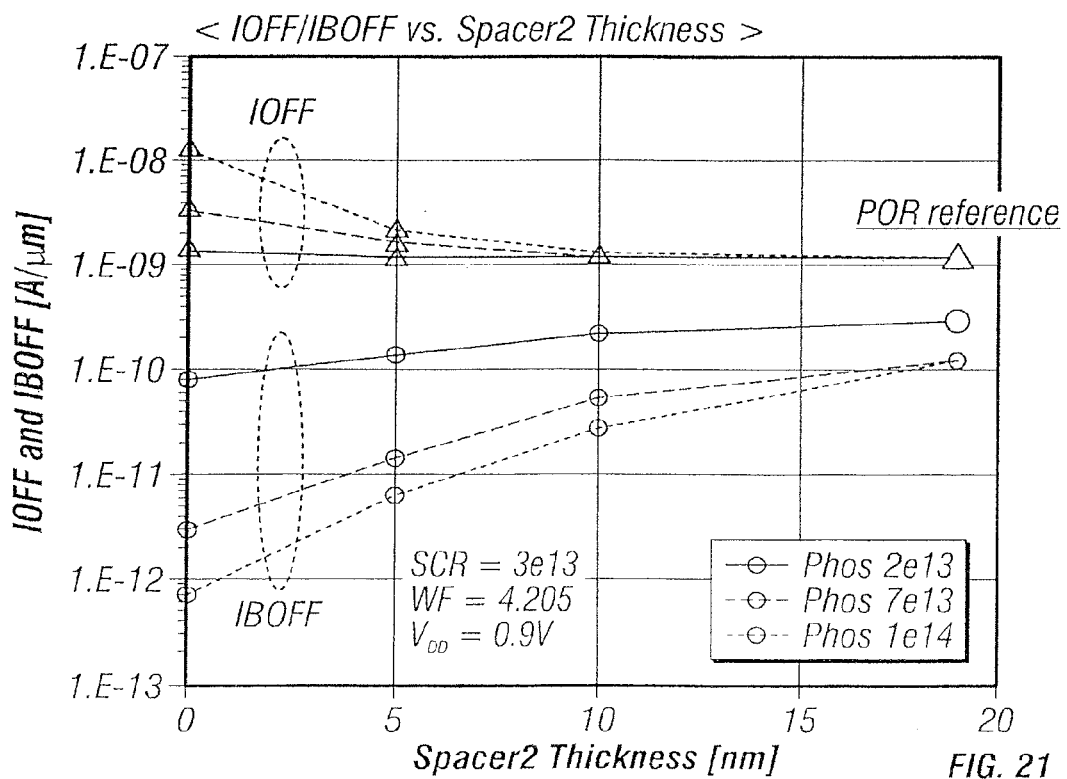
FIG. 21 illustrates a comparison of threshold voltage and junction leakage for different thicknesses of a second offset spacer and different doses of Phosphorous.

FIG. 21 shows a comparison of sub-threshold current and junction leakage current for different thicknesses of intermediate spacer 1908 and different doses of Phosphorous. Significant reduction in junction leakage current can be obtained through modulation of intermediate spacer 1908 thickness and Phosphorous dose. For intermediate spacer 1908 thicknesses down to 5 nanometers, there is no significant affect on sub-threshold current.

Figure 22:
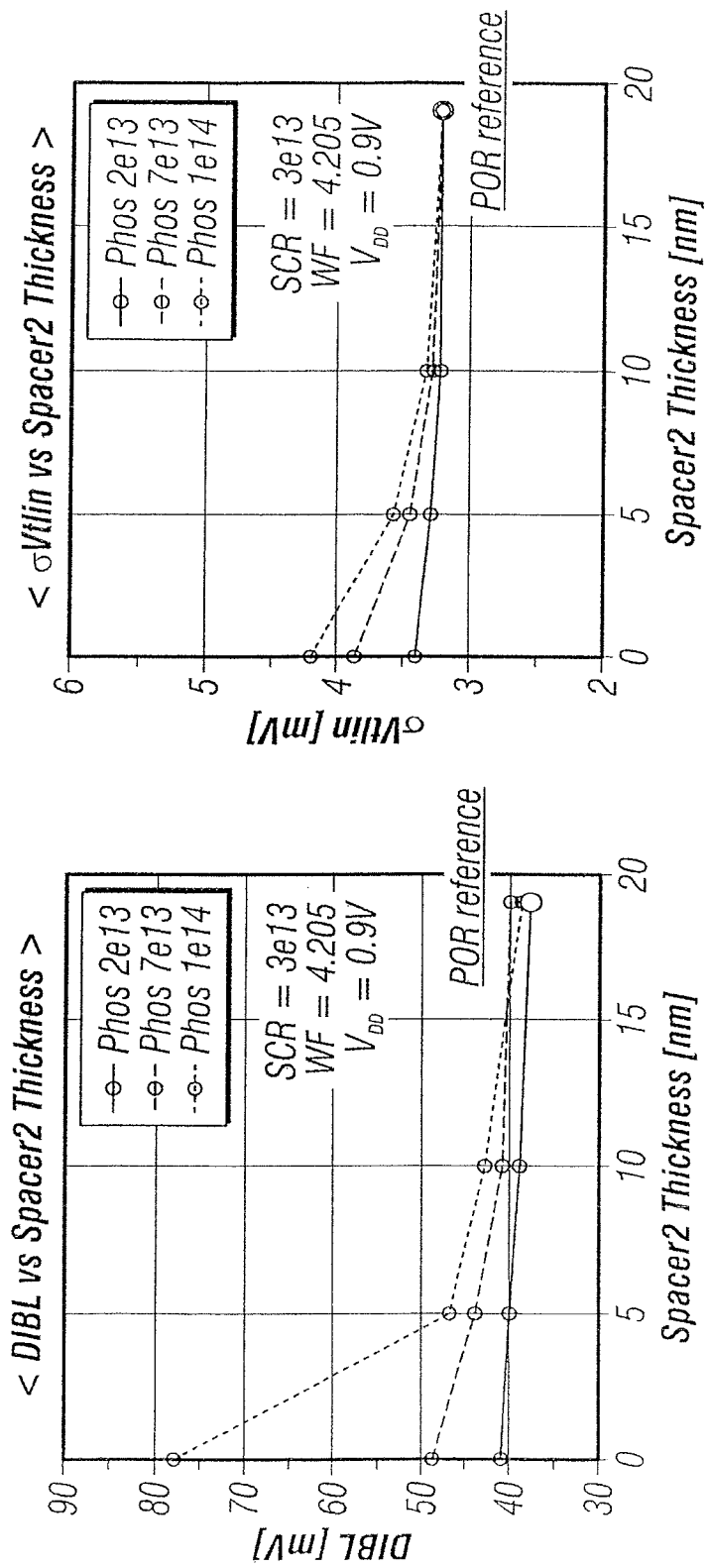
FIG. 22 illustrates a comparison of DIBL and σVt for different thicknesses of a second offset spacer.

FIG. 22 shows a comparison of DIBL and σVt for different thicknesses of intermediate spacer 1908. For thicknesses of intermediate spacer 1908 down to 5 nanometers, only minor penalties in DIBL and σVt are seen, insignificant to the overall gain obtained through the reduction of junction leakage for the transistor device.

Table I provides a comparison of exemplary conditions in a two offset spacer implementation versus a three offset spacer implementation. For SRAM, High Vt and Ultra-High Vt devices, use of an intermediate offset spacer offers a large advantage in junction leakage current outweighing the small loss in DIBL and σVt.

TABLE I

|  | Two Spacer Usage | Three Spacer Usage |
|---|---|---|
| Intermediate Spacer thickness | 0 nm (total thickness of two spacers is typically 19 nm) | 7 nm to 12 nm (assuming that when added to first spacer and third spacer, total spacer thickness equals 19 nm) |
| Phosphorous Dose | $2 \times 10^{13}$ atoms/cm$^2$ | $7 \times 10^{13}$ atoms/cm$^2$ |
| Junction Leakage | 284 pA/μm | 25.1 pA/μm (10x gain) |
| $V_{TSAT}$ | 202 mV | 190 mV |
| $V_{TLIN}$ | 240 mV | 232 mV |
| DIBL | 38 mV | 42 mV (11% loss) |
| $\sigma V_{TLIN}$ | 3.24 mV | 3.38 mV (4.3% loss) |

An additional problem arises for narrow-Z as well as short channel devices during fabrication when back gate control is lost. Silicon loss due to shallow trench isolation erosion that occurs during a typical fabrication process allows for the source/drain implants to go deeper than desired. The source/drain depletion areas may touch each other and body contact to the anti-punchthrough and/or screening layer is disconnected. Increasing the dose for an anti-punchthrough layer or the screening layer may offset this problem but junction leakage current is adversely higher.

Figure 23:
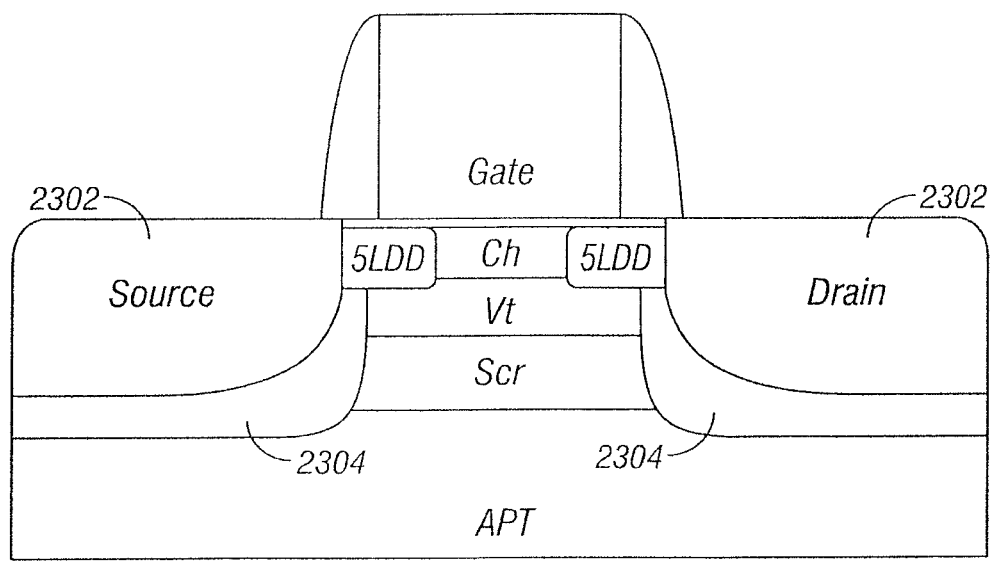
FIG. 23 illustrates a deep implant for a compensation layer to help control out-diffusion from the source and drain.

FIG. 23 shows an exemplary solution to this problem. At the source/drain masking step, a deep implant is performed prior to the source/drain region 2302 implant. A p-type-forming deep implant dopant, such as Boron, is used for a NMOS device. A n-type-forming deep implant dopant, such as Phosphorous or Arsenic, is used for a PMOS device. This implant forms a compensation layer 2304 preferably in alignment with the source/drain regions, to prevent the source/drain implants from diffusing too deep or getting too close to each other. Compensation layer 2304 can be formed using ion implant using doses that are consistent with the doses selected for the source/drain implants, and energies that are either consistent with or slightly higher than the energies for the source/drain implants. Compensation layer 2304 implant is preferably angled to help ensure placement of compensation 2304 at the desired location. Other aspects of specific recipes are tailored using conventional methods for the given dopant species. Note that compensation layer 2304 can be used in the context of a selective epitaxially formed source and drain structure as well. Compensation layer 2304 should have a peak near the bottom of the source/drain region and form a barrier to prevent the diffusion of the source and drain. In addition to preventing the loss of back gate control, this process can be easily implemented as a single implant step with no additional masking step or thermal process required. With the compensation layer 2304 being relatively deep, there is no effect on the channel layer. Compensation layer 2304 has a deeper and slower profile having minimal impact on junction leakage current.

The dLDD technique, the Phosphorous grading technique, the intermediate spacer technique, and the compensation layer technique discussed above may be performed alone or in any combination with each other for fabrication of a transistor device.

The foregoing Detailed Description refers to accompanying drawings to illustrate exemplary embodiments consistent with the invention. References in the Detailed Description to "one exemplary embodiment," "an illustrative embodiment," "an exemplary embodiment," and so on, indicate that the exemplary embodiment described may include a particular feature, structure, or characteristic, but every exemplary or illustrative embodiment may not necessarily include that particular feature, structure, or characteristic. Moreover, such phrases are not necessarily referring to the same exemplary embodiment. Further, when a particular feature, structure, or characteristic is described in connection with an embodiment, it is within the knowledge of those skilled in the relevant art(s) to affect such feature, structure, or characteristic in connection with other embodiments whether or not explicitly described.

The exemplary embodiments described herein are provided for illustrative purposes, and are not limiting. Other embodiments are possible, and modifications may be made to the exemplary embodiments within the spirit and scope of the invention. Therefore, the Detailed Description is not meant to limit the invention. Rather, the scope of the invention is defined only in accordance with the subjoined claims and their equivalents.

The foregoing Detailed Description of the exemplary embodiments will so fully reveal the general nature of the invention that others can, by applying knowledge of those skilled in the relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in the relevant art(s) in light of the teachings herein.

What is claimed is:

1. A method for fabricating a transistor with reduced junction leakage current, comprising:
    forming a layered stack, the layered stack including at least a doped screening layer and an undoped channel layer over the doped screening layer;
    forming a gate over the undoped channel layer, the gate having an effective gate length;
    forming a source region on one side of the gate and a drain region on another side of the gate; wherein
    a depth of the doped screening layer is set a preselected distance below the gate such that the distance is a fraction of the effective gate length of the transistor, a thickness of the doped screening layer is preselected such that a bottom of the doped screening layer is above a bottom of the source region and a bottom of the drain region, the doped screen layer extends laterally to and contacts both the source region and the drain region, and further comprising:
    forming a shallow lightly doped drain region in the undoped channel layer on either side of the gate and extending a defined distance inward from an outer edge of the gate; and
    forming a deep lightly doped drain region on either side of the gate at a depth of the doped screening layer.

* * * * *